(12) United States Patent
Tanaka et al.

(10) Patent No.: US 8,071,408 B2
(45) Date of Patent: Dec. 6, 2011

(54) METHOD OF MANUFACTURING SEMICONDUCTOR LIGHT EMITTING ELEMENT, AND SEMICONDUCTOR LIGHT EMITTING ELEMENT

(75) Inventors: Satoshi Tanaka, Tokyo (JP); Yusuke Yokobayashi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 158 days.

(21) Appl. No.: 12/614,536

(22) Filed: Nov. 9, 2009

(65) Prior Publication Data

US 2010/0117115 A1    May 13, 2010

(30) Foreign Application Priority Data

Nov. 12, 2008    (JP) ................. 2008-289874

(51) Int. Cl.
*H01L 21/00*    (2006.01)
(52) U.S. Cl. .............. 438/38; 438/22; 257/E33.005
(58) Field of Classification Search ............ 438/38, 438/46, 22, 503, 690, 633, 745; 257/103
See application file for complete search history.

(56) References Cited

U.S. PATENT DOCUMENTS

2005/0156189 A1* 7/2005 Deguchi et al. .............. 257/103
2009/0294784 A1* 12/2009 Nakahara et al. .............. 257/98

FOREIGN PATENT DOCUMENTS

| JP | 2007-088404 A | 4/2007 |
| JP | 2007-165409 A | 6/2007 |

* cited by examiner

*Primary Examiner* — Chuong A Luu
*Assistant Examiner* — Nga Doan
(74) *Attorney, Agent, or Firm* — Holtz, Holtz, Goodman & Chick, PC (57) ABSTRACT

A method includes steps of: sequentially growing a first semiconductor layer of a first conductivity type, an active layer, and a second semiconductor layer of a second conductivity type on a growth substrate to form a layered structure; separating the substrate from the layered structure to expose the first layer; performing wet etching on an exposed surface to form defect depressions; forming an insulating layer on the exposed surface; polishing the insulating layer and the first layer to flatten the surface of the first layer; and performing wet etching on the surface of the first layer to form protrusions deriving from a crystal structure.

9 Claims, 9 Drawing Sheets

METHOD OF MANUFACTURING SEMICONDUCTOR LIGHT EMITTING ELEMENT, AND SEMICONDUCTOR LIGHT EMITTING ELEMENT

BACKGROUND OF THE INVENTION

1. Technical Field

The present invention relates to a method of manufacturing a semiconductor light emitting element, and a semiconductor light emitting element, and particularly to a manufacturing method which forms multiple protrusions in the uppermost layer of a semiconductor stacked or layered structure, and a semiconductor light emitting element manufactured by the method.

2. Description of the Related Art

Light emitting diodes (hereinafter, referred to as LEDs) are used mainly in tail lamps of automobiles, a variety of the backlights of display devices and mobile devices such as cellular phones. The demand for them for use in the headlights of automobiles, the backlights of liquid crystal displays, and general lights is expected to greatly increase in the future. The luminous efficiencies of current LEDs are at and around 50 lm/W (lumens/watt), and it is said that a luminous efficiency of 100 lm/W or greater is required of them to be used in backlights, lighting devices, or the like. The luminous efficiency of an LED is determined by the product of the internal quantum efficiency at light emission in the light emitting layer and the efficiency in taking the light outside (i.e., light extraction efficiency). To date, the internal quantum efficiency has been improved up to 80% or greater, but there is substantial room for improvement in the light extraction efficiency.

As a technique for improving the light extraction efficiency, it is known to perform asperity or protrusions/depressions process on the light emitting surface of a semiconductor light emitting element. By performing the asperity process on the light emitting surface, total reflection of light at the interface between the semiconductor light emitting element and encapsulation resin can be reduced, thus improving the light extraction efficiency.

This asperity shape can be formed by performing an appropriate process on each light emitting surface (a p-layer surface, the front/back surface of a growth substrate, and an n-layer surface after removal of a growth substrate) of a semiconductor light emitting element. Here, the "growth substrate" refers to a substrate that is used to grow semiconductor layers constituting a semiconductor light emitting element. For example, Japanese Patent Application Laid-Open Publication No. 2007-165409 (Reference 1) discloses a technique which improves the light extraction efficiency by forming pyramidal or pyramid-shaped protrusions in the surface of an n-layer (n-GaN layer) after removal of the growth substrate by wet etching using an alkaline solution such as KOH. A semiconductor light emitting element having such pyramidal protrusions is formed by undergoing the following process steps.

Figure 1A:
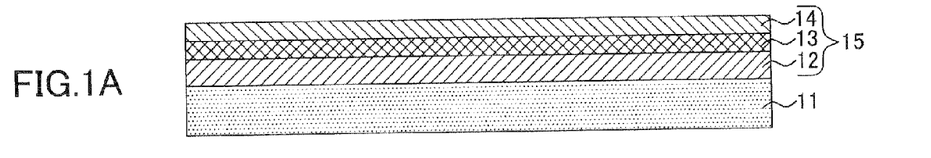
FIGS. 1A-1F are cross-sectional views of a conventional semiconductor light emitting element in production steps respectively.
Figure 1B:
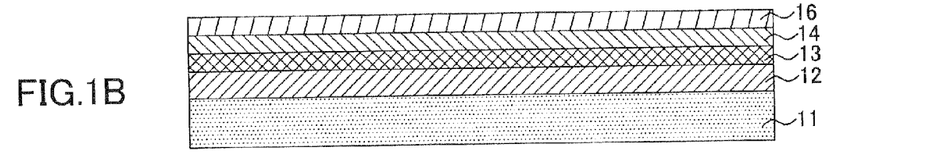
Figure 1C:
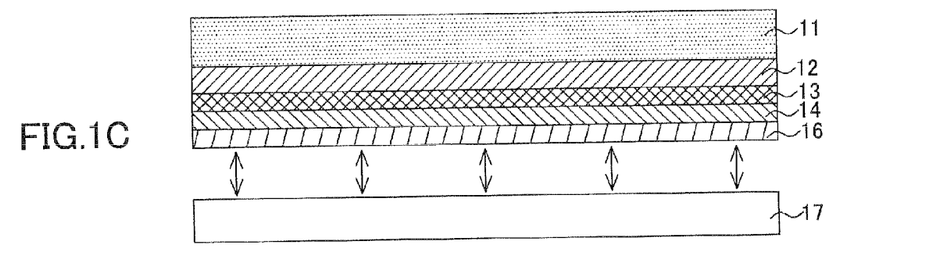
Figure 1D:
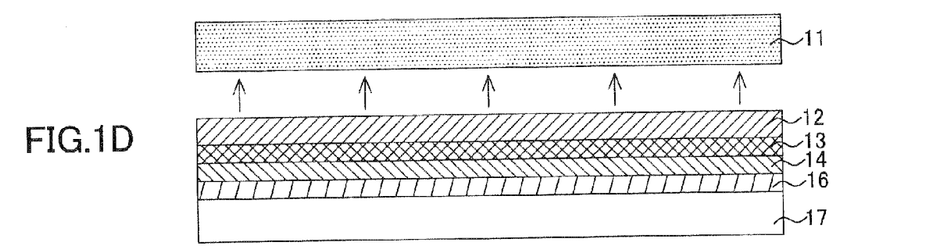
Figure 1E:
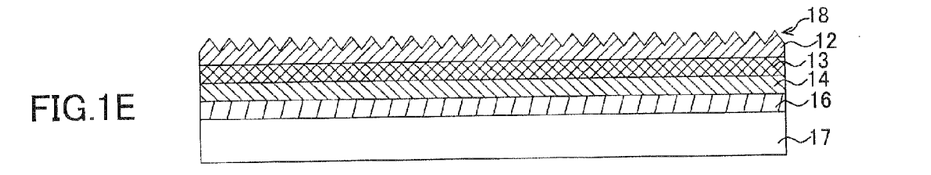
Figure 1F:
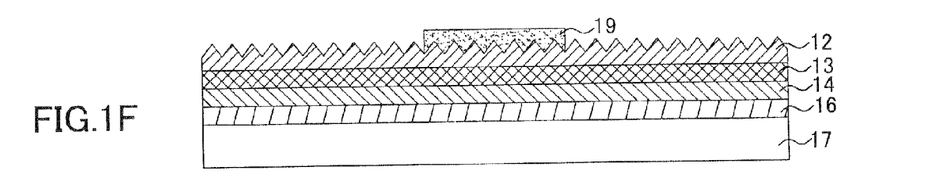

As shown in FIG. 1A, an epitaxial layer 15 structured to have an n-type semiconductor layer (n-layer) 12, an active layer 13, and a p-type semiconductor layer (p-layer) 14 sequentially laid one over another is formed on a sapphire substrate 11 (hereinafter, referred to as a growth substrate 11) used to grow an epitaxial layer (semiconductor layer), by a metal organic chemical vapor deposition (MOCVD) method (FIG. 1A). Then, a first electrode layer 16 is formed on the p-type semiconductor layer 14 by a vacuum evaporation method (FIG. 1B). Subsequently, a conductive support substrate 17 and the first electrode layer 16 are put opposite to and in close contact with each other and bonded together by thermal compression in a nitrogen atmosphere (FIG. 1C). Note that a solder layer (not shown) is formed on the conductive support substrate 17 and that by the solder layer melting and solidifying, the wafer having the epitaxial layer 15 and the first electrode layer 16 formed thereon can be bonded to the conductive support substrate 17. After the above bonding process, the growth substrate 11 is removed by a laser lift-off (LLO) method (FIG. 1D). Then, by performing wet etching using a KOH solution on the surface of the n-type semiconductor layer 12 exposed by laser lift-off, pyramidal protrusions 18 are formed in the surface of the n-type semiconductor layer 12 (FIG. 1E). After the protrusions 18 are formed, a second electrode layer 19 is formed by sputtering (FIG. 1F), and then by dicing into chips, semiconductor light emitting elements are finished.

Pits (depressions) deriving from crystal defects appear on the surface of the n-type semiconductor layer after the growth substrate is removed by laser lift-off. Here, the crystal defect refers to a dislocation (threading dislocation) caused by the difference in lattice constant (lattice misfit or mismatch) between the growth substrate and the semiconductor layer. If an electrode is formed on a surface where a lot of such pits are exposed, the problem occurs that electrode material goes into pits, causing a failure such as a leak or a short of current in the semiconductor light emitting element itself. Even where an electrode is not directly in contact with a pit (that is, an electrode is not formed on a pit), the use of the semiconductor light emitting element over a long time or the use of the semiconductor light emitting element in its high current range may cause electrode material to diffuse into the epitaxial layer and eventually reach a crystal defect, thus causing a failure such as a leak current or a short in the semiconductor light emitting element itself.

Japanese Patent Application Laid-Open Publication No. 2007-88404 (Reference 2) discloses a technique which improves the electrostatic discharge (ESD) resistance of semiconductor light emitting elements by filling crystal defects in the epitaxial layer with an insulating layer.

SUMMARY OF THE INVENTION

However, the technique disclosed in Reference 2 cannot be applied to the surface of the n-type semiconductor layer after the growth substrate is removed by the laser lift-off for the following reasons.

Figure 2A:
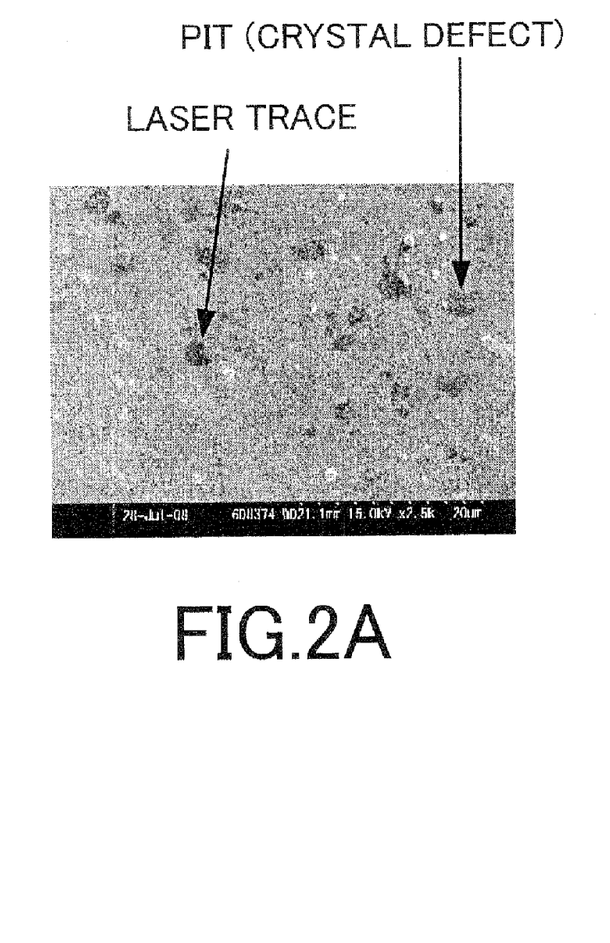
FIG. 2A is an SEM image of the surface of a semiconductor layer just after laser lift-off.

First, as can be seen from a scanning electron microscope image (hereinafter, simply referred to as an SEM image) shown in FIG. 2A, in the surface of the n-type semiconductor layer after the growth substrate is removed by laser lift-off, there are depressions occurring due to the decomposition of the GaN layer at laser irradiation and gallium droplets as well as pits deriving from crystal defects. The depths of pits due to crystal defects and the depths of depressions formed by laser irradiation are nearly equal, about 15 to 25 nm (nanometers). With the technique disclosed in Reference 2, it is difficult to fill only pits due to crystal defects with an insulating layer, and hence the luminous efficiencies of semiconductor light emitting elements cannot be improved sufficiently.

Figure 2B:
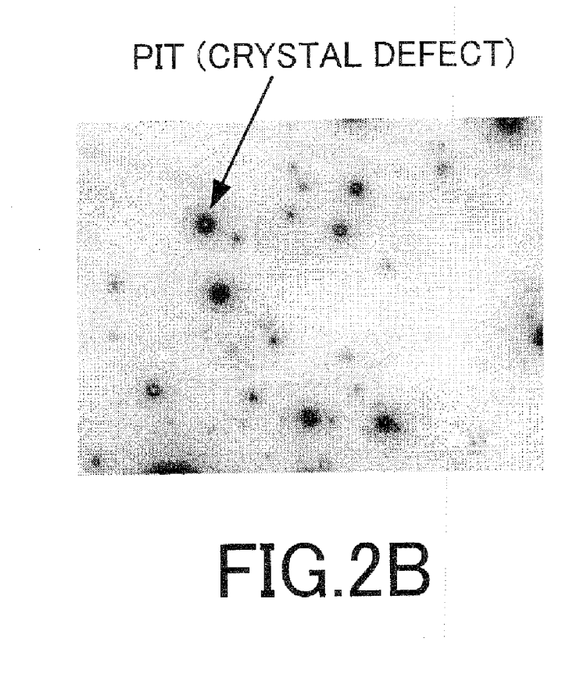
FIG. 2B is a PL image of the surface of the semiconductor layer just after laser lift-off.

Next, as can be seen from a photoluminescence microscope image (hereinafter, simply referred to as a PL image) shown in FIG. 2B, in the surface of the n-type semiconductor layer after the growth substrate is removed by laser lift-off, there can be ascertained more crystal defects, appearing as black dots, than are predicted from the SEM image. This is thought to be because small pits deriving from crystal defects which can be ascertained in the PL image are hidden by asperities or projections/depressions formed by the laser irradiation, so that those small pits cannot be ascertained in the SEM image. With the technique disclosed in Reference 2, it is difficult to reliably fill also small pits deriving from crystal defects hidden by projections/depressions formed by the laser irradiation with an insulating layer.

Figure 3A:
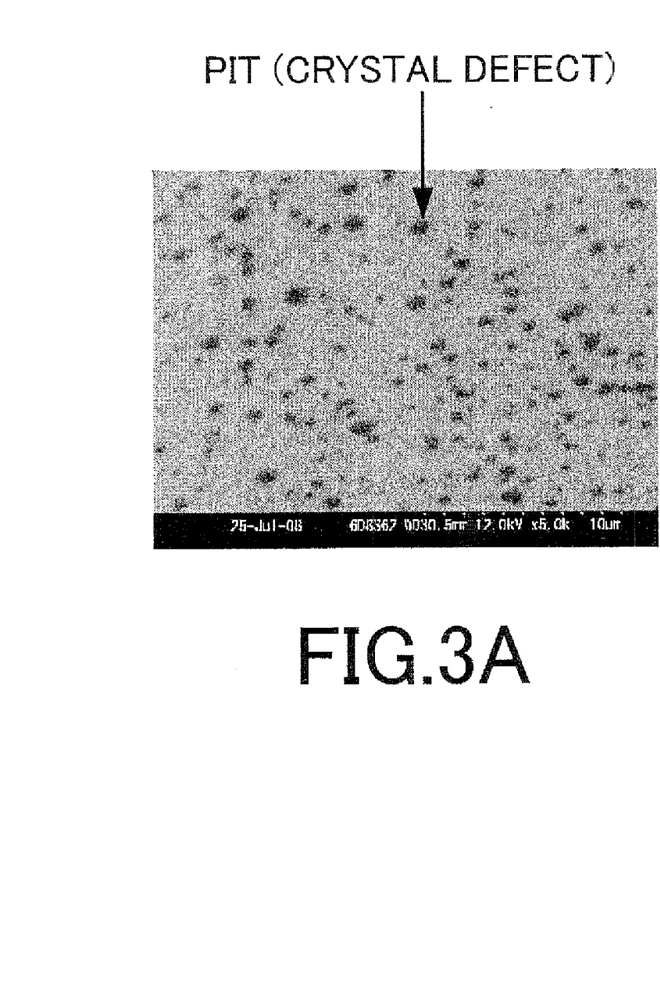
FIG. 3A is an SEM image of the surface of the semiconductor layer on which etching has been performed after laser lift-off.
Figure 3B:
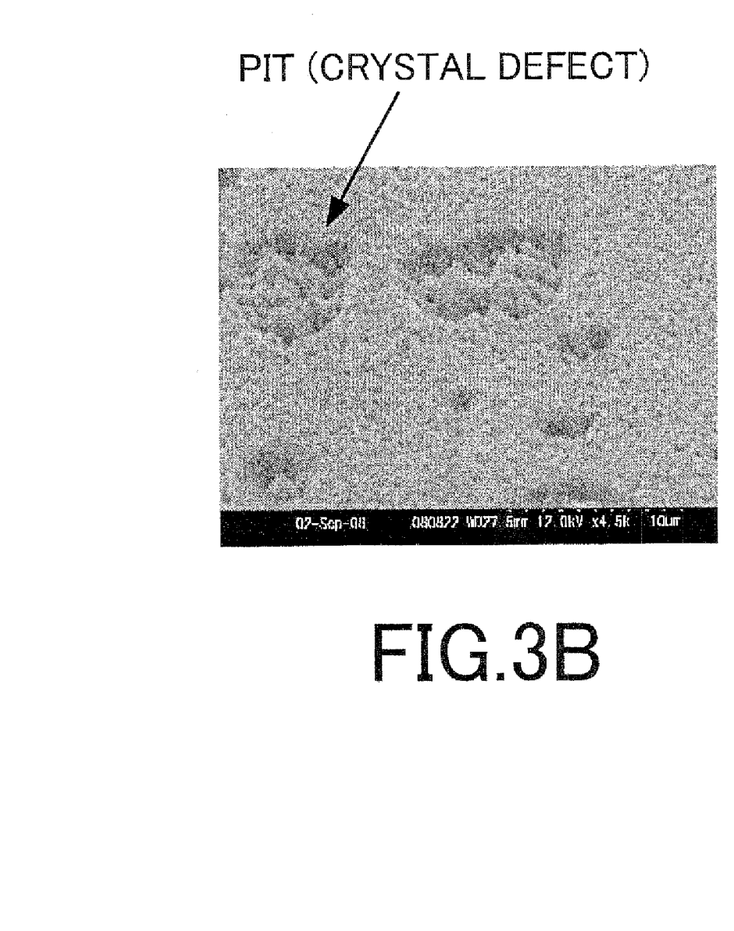
FIG. 3B is an enlarged view of part of FIG. 3A.

Next, FIGS. 3A, 3B show SEM images of the surface of the n-type semiconductor layer etched to a depth of about 2 μm (micrometers) after performing laser lift-off. FIG. 3B is an enlarged SEM image of pits due to crystal defects in FIG. 3A. As can be seen by comparing FIGS. 2A, 2B with FIG. 3A, after the etching, pits deriving from crystal defects are smaller than before etching, but the number of pits is increased. That is, pits deriving from crystal defects which did not appear after laser lift-off also appear by etching the surface of the semiconductor layer 12. Thus, there is the problem that when forming an insulating layer entirely over the surface of the n-type semiconductor layer after laser lift-off and removing unnecessary part of the insulating layer by etching, new pits deriving from crystal defects appear.

The present invention was made in view of the above problems, and objects thereof are to improve the light extraction efficiency and provide a semiconductor light emitting element excellent in reliability and a method of manufacturing the same, and in addition to provide a method of manufacturing a semiconductor light emitting element, which can reliably fill only pits deriving from crystal defects in the outermost surface of the epitaxial layer after growth substrate removal.

According to the present invention there is provided a method of manufacturing a semiconductor light emitting element, which includes a growing step of sequentially growing a first semiconductor layer of a first conductivity type, an active layer, and a second semiconductor layer of a second conductivity type on a growth substrate to form a layered structure; a separating step of separating the growth substrate from the layered structure to expose the first semiconductor layer; a depression forming step of performing wet etching on an exposed surface of the first semiconductor layer to form defect depressions deriving from crystal defects; an insulating layer forming step of forming an insulating layer on the exposed surface of the first semiconductor layer; a polishing step of polishing portions of the insulating layer and of the first semiconductor layer to flatten the surface of the first semiconductor layer; and a surface roughening step of performing wet etching on the surface of the first semiconductor layer to form protrusions deriving from a crystal structure.

According to the present invention there is provided a semiconductor light emitting element, which includes a first semiconductor layer of a first conductivity type; a second semiconductor layer of a second conductivity type; an active layer provided between the first semiconductor layer and the second semiconductor layer; and an electrode layer formed on the first semiconductor layer, wherein in a surface of the first semiconductor layer, only defect depressions deriving from crystal defects are filled with an insulating layer, and protrusions deriving from a crystal structure are formed in areas other than where the electrode layer and the insulating layer are formed.

According to the method of manufacturing a semiconductor light emitting element of the present invention, a growth substrate is prepared, and a layered structure having a first semiconductor layer, an active layer, and a second semiconductor layer sequentially laid one over another is formed on the growth substrate, and the growth substrate is separated from the layered structure to expose the first semiconductor layer. Wet etching is performed on an exposed surface of the first semiconductor layer, and an insulating layer is formed on the exposed surface of the first semiconductor layer. Portions of the insulating layer and of the first semiconductor layer are polished, and wet etching is performed on the surface of the first semiconductor layer. Hence, the light extraction efficiency is improved and a semiconductor light emitting element excellent in reliability and a method of manufacturing the same can be provided.

Further, according to the above method of manufacturing a semiconductor light emitting element, in the outermost surface of the epitaxial layer after the growth substrate removal, only pits deriving from crystal defects can be accurately filled.

DETAILED DESCRIPTION OF THE INVENTION

An embodiment of the present invention will be described in detail below with reference to the accompanying drawings.

Embodiment

First, the structure of a semiconductor light emitting element according to an embodiment of the present invention will be described with reference to FIGS. 4A, 4B.

Figure 4A:
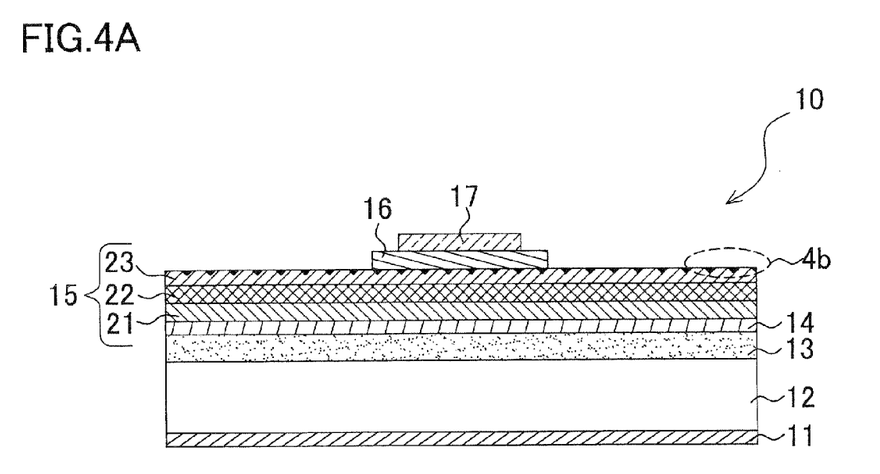
FIG. 4A is a cross-sectional view of a semiconductor light emitting element that is an embodiment of the present invention.

FIG. 4A is a cross-sectional view of a semiconductor light emitting element 10 according to the embodiment of the present invention. FIG. 4B is an enlarged view of the area 4b enclosed by the broken line in FIG. 4A. As shown in FIG. 4A, the semiconductor light emitting element 10 according to the present embodiment includes a first electrode layer 11, a conductive support substrate 12, a conductive joint layer 13, a second electrode layer 14, an epitaxial layer 15, a third electrode layer 16, and an electrode pad 17. The epitaxial layer 15 includes a p-type semiconductor layer 21, an active layer 22, and an n-type semiconductor layer 23. Further, as shown in FIGS. 4A, 4B, pits (depressions) deriving from crystal defects 24 in the n-type semiconductor layer 23 are filled with an insulating layer 25. Further, multiple protrusions or projections 26 deriving from the crystal structure of the epitaxial layer 15 are formed in portions of the surface of the n-type semiconductor layer 23 which are not filled with the insulating layer 25 by wet etching using an alkaline solution. Here, the crystal defect refers to a dislocation caused by the difference in lattice constant (lattice misfit) between a growth substrate used for growing the epitaxial layer 15 (hereinafter, simply referred to as a "growth substrate") and the epitaxial layer 15. In particular, a dislocation occurring in a stacking direction of the epitaxial layer 15 is referred to as a threading dislocation. Each of the constituents will be described in detail below.

The conductive support substrate 12 is a substrate made of silicon doped with an n-type or p-type impurity. The doped impurity is, for example, boron. Other than silicon, a conductive material high in thermal conductivity such as copper may be used for the conductive support substrate 12. Or, a metal composite substrate including two or more types of metals (e.g., a metal composite substrate of copper and tungsten) may be used as the conductive support substrate 12. The thickness of the conductive support substrate 12 is desirably about 50 to 600 μm (micrometers) from the viewpoints of the workability in the production process and the thermal conductivity (or heat radiative properties) of the semiconductor light emitting element. On the side, one main surface (hereinafter called a first main surface), of the conductive support substrate 12 opposite to the conductive joint layer 13, the first electrode layer 11 is formed by an electron beam evaporation method. The first electrode layer 11 is a multilayered film of, e.g., titanium and platinum. The film thickness of titanium is about 25 nm (nanometers), and the film thickness of platinum is about 100 nm. On the surface (hereinafter called a second main surface) opposite to the first main surface of the conductive support substrate 12, the conductive joint layer 13 is formed. The conductive joint layer 13 is a layer of an AuSnNi alloy formed by performing thermal compression on metals such as AuSn, Au, and Ni.

The epitaxial layer 15 has the n-type semiconductor layer 23, the active layer 22, and the p-type semiconductor layer 21 laid one over another in this order, and by this stacking, has a semiconductor laminated or stacked structure. The material of the epitaxial layer 15 is, for example, $Al_xIn_yGa_zN$ ($0 \leq x \leq 1$, $0 \leq y \leq 1$, $0 \leq z \leq 1$, $x+y+z=1$). The n-type semiconductor layer 23 is constituted by, e.g., an n-type GaN layer doped with silicon. The active layer 22 has a multiple quantum well structure of, e.g., InGaN/GaN. The p-type semiconductor layer 21 is constituted by, e.g., a p-type GaN layer doped with magnesium.

Figure 4B:
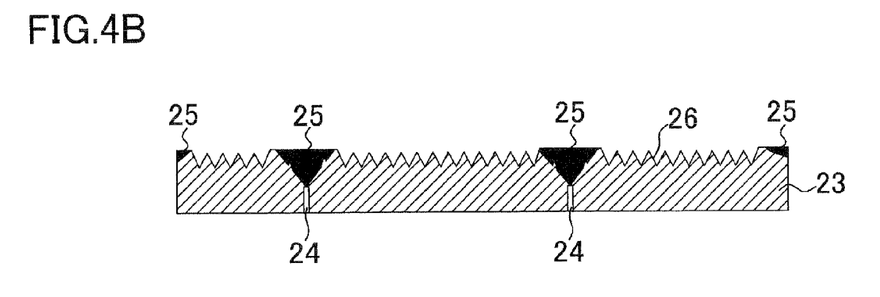
FIG. 4B is an enlarged view of the area enclosed by broken line 4b in FIG. 4A.

As shown in FIG. 4B, multiple crystal defects 24 occurring in a stacking direction of the crystal layers in the growth process of different types of crystal layers exist in the n-type semiconductor layer 23. The depressions or recesses on top of the crystal defects 24 are filled with the insulating layer 25. Since the depressions on top of the crystal defects 24 are filled with the insulating layer 25, the pits deriving from the crystal defects 24 are not exposed on the surface of the n-type semiconductor layer 23. Hence, the third electrode layer 16 is not formed on pits deriving from the crystal defects 24, and thus the occurrence of a failure such as a leak or a short due to the electrode material reaching the crystal defect 24 can be prevented. Further, not only the outermost surface of part of the insulating layer 25 located at the interface between the third electrode layer 16 and the n-type semiconductor layer 23 but also the outermost surface of the exposed part of the insulating layer 25 (i.e., the exposed surface of the insulating layer 25) is in the same plane as the interface between the third electrode layer 16 and the n-type semiconductor layer 23.

Generally, in the production of group-III nitride semiconductor devices, a sapphire (C face or C plane) substrate that is a hexagonal crystal is used as the growth substrate. A group-III nitride semiconductor crystal having a wurtzite type of crystal structure grows on the sapphire substrate as the growth substrate in such a way that its C-axis is aligned with that of the sapphire substrate. This wurtzite structure has no symmetry along a C-axis direction, i.e., the growth direction, and taking GaN as an example, there are two GaN films different crystallographically and having an epitaxial relationship that can grow. That is, there are a GaN film having a Ga plane (C+ plane) where Ga atoms are arranged as the outermost surface and a GaN film having an N plane (C− plane) where N atoms are arranged as the outermost surface. The polarity of the former GaN film is called Ga polarity (group-III polarity), and the polarity of the latter GaN film is called N polarity (group-V polarity).

A GaN film that is formed by so-called C+ growth where a semiconductor layer is grown such that its surface (outermost surface after growth) opposite to the growth substrate is a surface having Ga polarity, is usually easier to grow epitaxially and is a single-crystal film of higher quality, and hence with this GaN film, optical semiconductor devices excellent in electrical and optical properties can be easily produced. This C+ growth becomes possible by performing preprocessing such as forming a low-temperature buffer layer on the growth substrate after performing thermal cleaning on the growth substrate.

The surface of the n-type semiconductor layer 23 on which the third electrode layer 16 is formed appears by removing the growth substrate. Thus, where the epitaxial layer 15 is constituted by the GaN film of Ga polarity as described above, the outermost surface of the n-type semiconductor layer 23 that appears by removing the growth substrate is the C− plane (N plane). Since the C− plane (N plane) is chemically unstable, projections/depressions can be formed by wet etching. Thus, protrusions 26 shaped like a six-sided pyramid or hexagonal pyramid, which is derived from a wurtzite type (hexagonal crystal) of crystal structure, can be easily formed by wet etching using an alkaline solution in the areas of the surface of the n-type semiconductor layer 23 where the insulating layer 25 or the third electrode layer 16 is not formed (i.e., in the areas around where the insulating layer 25 or the third electrode layer 16 is formed). Hereinafter in this embodiment these protrusions 26 are called six-sided or hexagonal pyramidal protrusions 26. For example, the size (height) of the pyramidal protrusion 26 is about 1 μm. Since the six-sided hexagonal pyramidal protrusions 26 are formed in the surface of the n-type semiconductor layer 23, the thickness of the n-type semiconductor layer 23 is, for example, about 5 μm. By securing a certain level of thickness for the n-type semiconductor layer 23, the current flowing through the n-type semiconductor layer 23 can spread laterally, and hence uniform current injection over the entire active layer 22 becomes possible. Thereby, a non-light-emitting area can be prevented from occurring, and thus an improvement in the luminous efficiency can be achieved. Further, the electrostatic withstand voltage of the semiconductor light emitting element 10 becomes higher, thus improving the reliability of the semiconductor light emitting element 10.

As described above, because the hexagonal pyramidal protrusion 26 is formed by wet etching, the top of the hexagonal pyramidal protrusion 26 is at a lower position than the outermost surface of the n-type semiconductor layer 23. That is, the top of the hexagonal pyramidal protrusion 26 is located on the n-type semiconductor layer 23 side of the interface between the third electrode layer 16 and the n-type semiconductor layer 23. Note that depending on the conditions for wet etching, hexagonal pyramidal protrusions 26 can be formed without changing the thickness of the n-type semiconductor layer 23. In this case, the top of the hexagonal pyramidal protrusion 26 will be located in the same plane as the interface between the third electrode layer 16 and the n-type semiconductor layer 23.

In contrast, the outermost surface of the p-type semiconductor layer 21 formed by a p-type GaN layer is constituted by the C+ plane (Ga plane). Since being chemically stable, the C+ plane (Ga plane) is difficult to form projections/depressions therein by wet etching.

On the area of the surface of the n-type semiconductor layer 23 where no hexagonal pyramidal protrusion 26 is formed, the third electrode layer 16, which is a transparent conductive film, is formed. That is, the area of the surface of the n-type semiconductor layer 23 where the third electrode layer 16 is formed is a flat surface with projections/depressions of 0.5 μm or less. For example, an oxide transparent conductive film of ITO (indium tin oxide) formed by sputtering can be used as the third electrode layer 16. Or, the third electrode layer 16 may be an opaque conductive film, not being limited to a transparent conductive film. In this case, the forming position of the third electrode layer needs to be determined so as to avoid the third electrode layer 16 reducing the luminous efficiency.

The electrode pad 17 that is formed on the third electrode layer 16 is a multi-layered film of, e.g., titanium and platinum, or titanium, platinum, and gold. For example, in the case of a multi-layered film of titanium and platinum, the film thickness of titanium is about 25 nm (nanometers), and the film thickness of platinum is about 100 nm.

As described above, the semiconductor light emitting element 10 of the embodiment has a structure in which the depressions on top of the crystal defects 24 are filled with the insulating layer 25, pits derived from the crystal defects 24 are not exposed on the surface of the n-type semiconductor layer 23. Hence, the third electrode layer 16 is not formed on pits deriving from the crystal defects 24, and thus the occurrence of a failure such as a leak current or a short due to the electrode material reaching a crystal defect 24 can be prevented.

Further, in the semiconductor light emitting element 10 of the embodiment, the loss of the light extraction efficiency due to reflection or the like at the interface between the growth substrate and the epitaxial layer is eliminated by removing the growth Further, because hexagonal pyramidal protrusions 26 are formed in the surface of the n-type semiconductor layer 23, which is a light emitting surface, reflected light due to total reflection at the interface (i.e., light not emitted outside) can be reduced as compared with the case where the light emitting surface is flat. That is, a further improvement in the light extraction efficiency of the semiconductor light emitting element 10 can be achieved.

Further, because the contact surface of the n-type semiconductor layer 23 with the third electrode layer 16 is a flat surface where no hexagonal pyramidal protrusion 26 is formed, the occurrence of a leak current can be suppressed.

Note that a barrier layer may be provided between the conductive joint layer 13 and the second electrode layer 14 in order to prevent the diffusion of eutectic material forming the conductive joint layer 13. The barrier layer may be of, e.g., TaN or TiW.

Next, a method of manufacturing the semiconductor light emitting element 10 having the above-described structure will be described with reference to FIGS. 5A-5D, FIGS. 6A-6C, FIGS. 7A-7D, FIGS. 8A-8C and FIGS. 9A-9C. FIGS. 5A-5D, FIGS. 6A-6C, FIGS. 7A-7D, FIGS. 8A-8C and FIGS. 9A-9C are cross-sectional views and enlarged cross-sectional views of the semiconductor light emitting element 10 in the process steps.

(Epitaxial Layer Growing Step)

In the present embodiment, a C-plane sapphire substrate 50 is used as a substrate (i.e., growth substrate) on which the epitaxial layer 15 of $Al_xIn_yGa_zN$ ($0 \leq x \leq 1$, $0 \leq y \leq 1$, $0 \leq z \leq 1$, $x+y+z=1$) can be formed by a metal organic chemical vapor deposition (MOCVD) method. The layers constituting the epitaxial layer 15 are laid one over another on the sapphire substrate 50 along a C-axis direction of a wurtzite type of crystal structure by the MOCVD method.

First, the sapphire substrate 50 that is the growth substrate is prepared (FIG. 5A), and thermal cleaning is performed on the prepared sapphire substrate 50. Specifically, the sapphire substrate 50 is transferred into an MOCVD apparatus and heated in a hydrogen atmosphere at about 1,000 degrees Celsius (1,000° C.) for about 10 minutes. Subsequently, the substrate temperature (i.e., growth temperature) is adjusted to about 500° C., and TMG (trimethylgallium) at a flow rate of 10.4 μmol/min and $NH_3$ at a flow rate of 3.3 LM are supplied for about 3 minutes, thereby forming a low-temperature buffer layer constituted by a GaN layer (not shown). Then, the substrate temperature is raised to about 1,000° C., and this condition is maintained for about 30 seconds to crystallize the low-temperature buffer layer. By performing the preprocessing, a semiconductor grown layer of Ga polarity (group-III polarity) excellent in electrical and optical properties is formed on the sapphire substrate 50. Subsequently, with the temperature kept at about 1,000° C., TMG at a flow rate of 45 μmol/min and $NH_3$ at a flow rate of 4.4 LM are supplied for about 20 minutes, thereby forming an unintentionally doped underlying GaN layer or GaN base layer (not shown) of about 1 μm thickness. Then, with the temperature kept at about 1,000° C., TMG at a flow rate of 45 μmol/min, $NH_3$ at a flow rate of 4.4 LM, and $SiH_4$ as dopant gas at a flow rate of $2.7 \times 10^{-9}$ mol/min are supplied for about 100 minutes, thereby forming the n-type semiconductor layer 23 constituted by an n-type GaN layer of about 5 μm thickness. Note that a certain level for the thickness of the n-type semiconductor layer 23 should be secured so that the active layer 22 is not exposed by subsequent wet etching and also so as to help the current to spread laterally in the n-type semiconductor layer 23.

Subsequently, the active layer 22 is formed on the n-type semiconductor layer 23. In the present embodiment, a multiple quantum well structure of InGaN/GaN is applied to the active layer 22, and with InGaN/GaN as a period, five periods of growth is performed. Specifically, with the temperature kept at about 700° C., TMG at a flow rate of 3.6 μmol/min, TMI (trimethylindium) at a flow rate of 10 μmol/min, and $NH_3$ at a flow rate of 4.4 LM are supplied for about 33 seconds, thereby forming an InGaN well layer of about 2.2 nm thickness. Subsequently, TMG at a flow rate of 3.6 μmol/min and $NH_3$ at a flow rate of 4.4 LM are supplied for about 320 seconds, thereby forming a GaN barrier layer of about 15 nm thickness. By repeating this process five periods, the active layer 22 is formed.

Then, the temperature is raised to about 870° C., and TMG at a flow rate of 8.1 µmol/min, TMA (trimethylaluminum) at a flow rate of 7.5 µmol/min, NH$_3$ at a flow rate of 4.4 LM, and CP2Mg (bis-cyclopentadienyl Mg) as a dopant at a flow rate of 2.9×10$^{-7}$ µmol/min are supplied for about 5 minutes, thereby forming the p-type AlGaN clad layer (not shown) of about 40 nm thickness. Subsequently, with the temperature kept at about 870° C., TMG at a flow rate of 18 µmol/min, NH$_3$ at a flow rate of 4.4 LM, and CP2Mg as a dopant at a flow rate of 2.9×10$^{-7}$ µmol/min are supplied for about 7 minutes, thereby forming the p-type semiconductor layer 21 constituted by a p-type GaN layer of about 150 nm thickness.

Figure 5A:
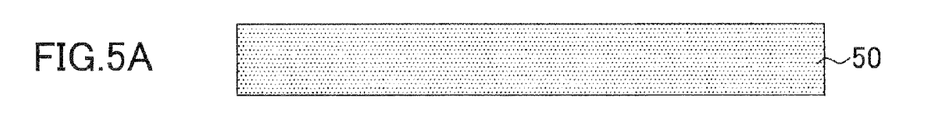
FIGS. 5A-5D are cross-sectional views of the semiconductor light emitting element according to the embodiment of the present invention in production steps respectively.
Figure 5B:
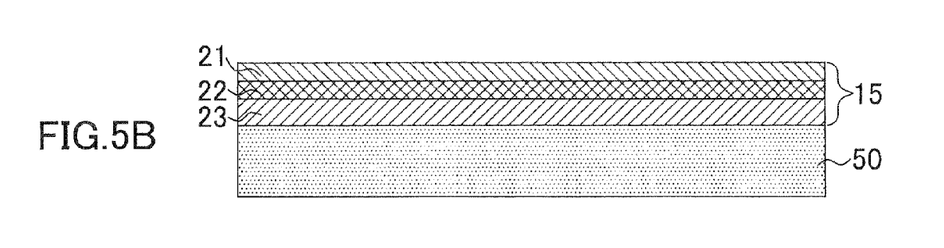

By undergoing the above process, the epitaxial layer 15 that is a semiconductor layer having a layered structure including the n-type semiconductor layer 23, the active layer 22, and the p-type semiconductor layer 21 sequentially laid one over another is formed. FIG. 5B shows a cross-sectional view of the epitaxial layer 15 after its formation is finished. Because each layer that is formed on the sapphire substrate 50 by the above process is formed by the C+ growth, the epitaxial layer 15 has Ga polarity where group-III element (Ga) atoms are arranged on its outermost top surface.

(Electrode Layer Forming Step)

Figure 5C:
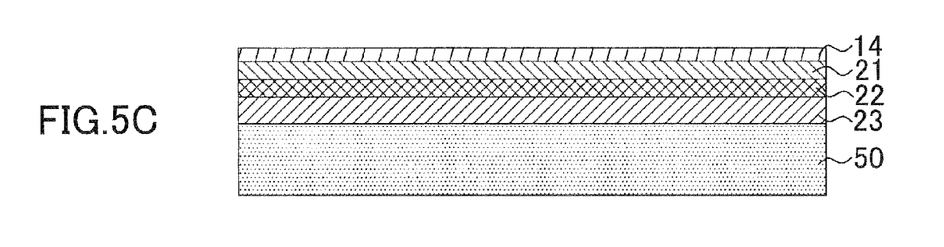

After the growth of the epitaxial layer 15, the second electrode layer 14 of ITO is formed on the p-type semiconductor layer 21 by an arc discharge ion plating method (FIG. 5C). The second electrode layer 14 may be formed by electron beam evaporation. Further, in order to prevent the diffusion of AuSn or the like used as eutectic material described later, a barrier layer of TaN or TiW may be formed on the second electrode layer 14 of ITO by electron beam evaporation.

(Conductive Support Substrate Bonding Step)

After the second electrode layer 14 is formed, the wafer obtained through the above process and the conductive support substrate 12 prepared are bonded together. Specifically, first, the conductive support substrate 12 made of silicon doped with boron is prepared. The first electrode layer 11 is already formed on the surface (first main surface) of the conductive support substrate 12 by sputtering and is a multi-layered film of, e.g., titanium and platinum. The film thickness of titanium is about 25 nm, and the film thickness of platinum is about 100 nm. Also, a solder layer 51 of Ni, Au, and AuSn laid one over another in that order is already formed over the surface (second main surface) of the conductive support substrate 12 opposed to the first main surface by sputtering. The Ni forming part of the solder layer 51 serves to absorb Sn when the AuSn melts. Also, the Ni has the effect of suppressing the peeling-off of the AuSn when re-solidifying after melting. Further, the film thickness of Ni is desirably about 100 nm or greater from the viewpoint of improving wettability to AuSn and suppressing peeling-off. Because Pt or Pd (palladium) also has the effect of suppressing the peeling-off of the AuSn when re-solidifying after melting, a layer of Pt or Pd may be formed instead of the Ni. The Au forming part of the solder layer 51 has the effects of improving the wettability of AuSn and preventing the oxidation of Ni. The film thickness of Au is, e.g., about 30 nm. The composition ratio of Au to Sn of the AuSn forming part of the solder layer 51 is at, e.g., about 8:2 in weight ratio and about 7:3 in ratio by the number of atoms. The film thickness of AuSn is, e.g., about 600 nm. The first electrode layer 11 and the solder layer 51 may be formed by electron beam evaporation.

Figure 5D:
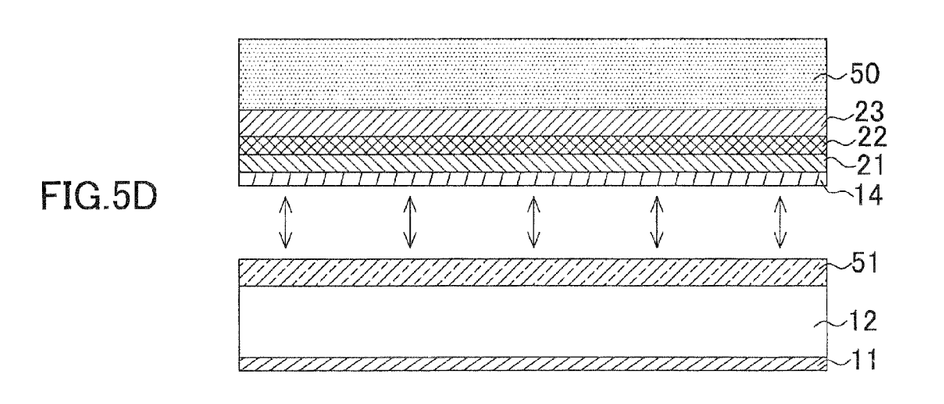
Figure 6A:
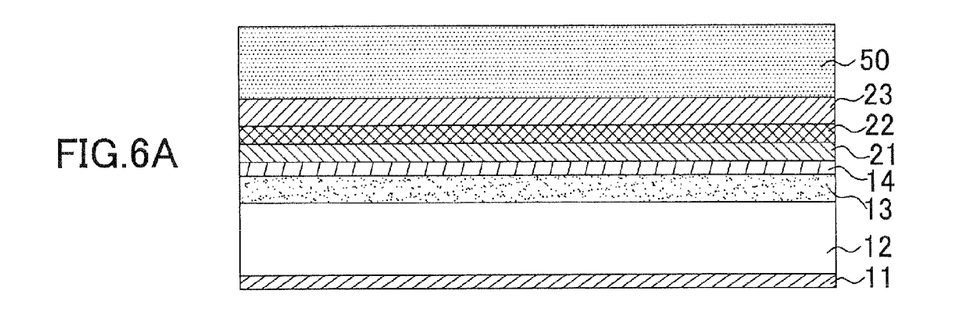
FIGS. 6A-6C are cross-sectional views of the semiconductor light emitting element according to the embodiment of the present invention in production steps respectively.

Then, the solder layer 51 of the conductive support substrate 12 and the second electrode layer 14 formed on the sapphire substrate 50 are put opposed to and in close contact with each other. Then, the sapphire substrate 50 and the conductive support substrate 12 are bonded together by thermal compression in a nitrogen atmosphere (FIG. 5D). Conditions for the thermal compression bonding are, for example, that the pressure is about 300 to 500 N/cm$^2$, that the temperature is about 280° C. to 370° C., and that the bonding time is about 10 minutes. By this thermal compression bonding, AuSn melts, and Au and Ni dissolve into the melted AuSn. Further, Au and Sn diffuse and are adsorbed to Ni. Subsequently, the melted AuSn solidifies, and thereby the conductive joint layer 13 of AuSnNi is formed (FIG. 6A).

Although, in the present embodiment, the solder layer 51 is formed only on the conductive support substrate 12 side, a solder layer 51 of Ni, Au, and AuSn may be formed on the second electrode layer 14 formed on the sapphire substrate 50 as well.

(Growth Substrate Separating Step)

After the conductive support substrate bonding step finishes, the sapphire substrate 50 is separated or removed from the epitaxial layer 15. A widely known technique such as laser lift-off (LLO) can be used to separate or remove the sapphire substrate 50. In the laser lift-off, laser light irradiation is performed from the sapphire substrate 50 side, and thus the energy of the laser light is absorbed by the GaN layer in the vicinity of the interface of the sapphire substrate 50 and the epitaxial layer 15. The absorbed energy changes into heat, which decomposes the GaN formed on the sapphire substrate 50 into metal Ga and N$_2$ gas. Hence, the decomposition occurs in the n-type semiconductor layer 23 or the underlying GaN layer, and after the sapphire substrate 50 is removed, the n-type semiconductor layer 23 or the underlying GaN layer appears. In either case, the outermost surface appearing after the sapphire substrate 50 is removed is the C– plane (N plane). The laser used in the laser lift-off can be, for example, a YAG laser, an excimer laser, or the like. A method other than laser lift-off such as grinding-polishing or dry etching can also be used to remove the sapphire substrate 50. Or, if a wet-etchable substrate such as a SiC, Si, or GaN substrate is used as the growth substrate, the growth substrate may be removed by wet etching. In either case, the outermost surface of the epitaxial layer 15 appearing after the growth substrate removal is the C– plane (N plane) (FIG. 6B).

Figure 6B:
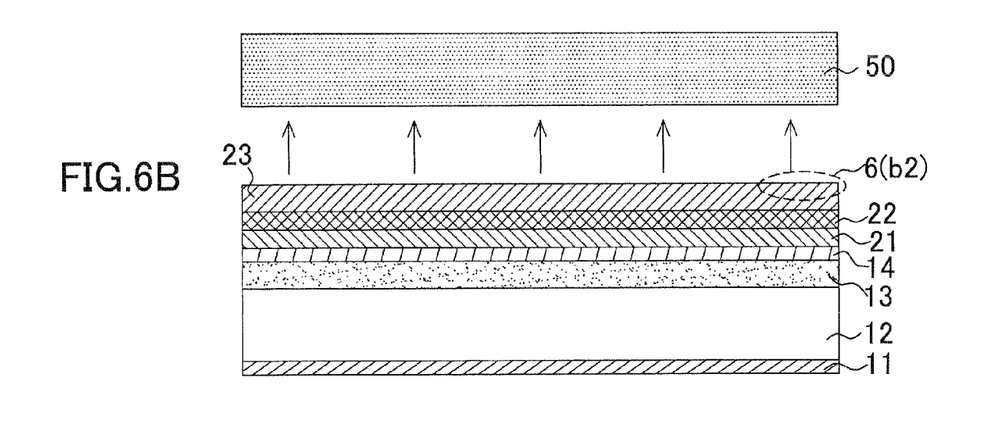
Figure 6C:
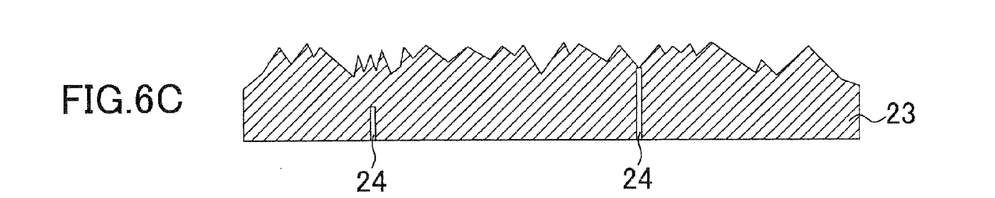

As shown in FIG. 6C that is an enlarged view of the area 6(b2) enclosed by the broken line in FIG. 6B, in the surface of the n-type semiconductor layer 23 after the laser lift-off, there are multiple pits (depressions) deriving from crystal defects 24, depressions occurring due to the decomposition of the GaN layer at laser irradiation, and depressions and bumps (projections) due to gallium droplets. Pits deriving from crystal defects 24 and depressions occurring due to the decomposition of the GaN layer are nearly the same in depth. Some crystal defects 24 do not appear as pits in the surface of the n-type semiconductor layer 23 because of depressions occurring due to the decomposition of the GaN layer and depressions and bumps due to gallium droplets.

(Defect Depression Forming Step)

Figure 7A:
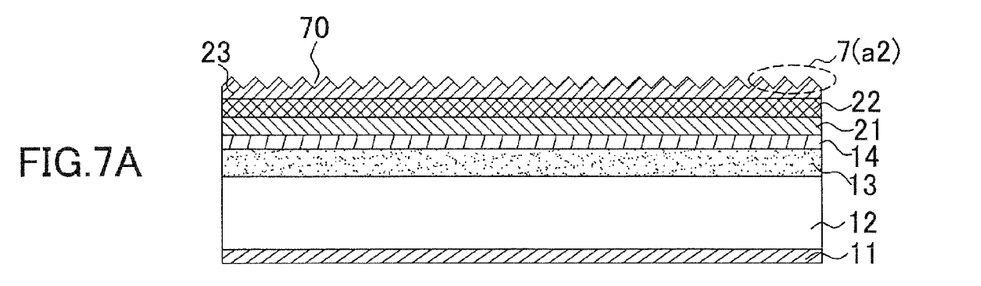
FIGS. 7A-7D are cross-sectional views of the semiconductor light emitting element according to the embodiment of the present invention in production steps respectively.
Figure 7B:
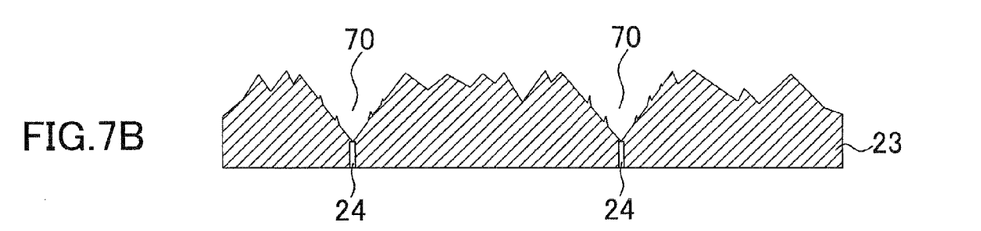

Then, wet etching is performed on the surface of the n-type semiconductor layer 23 on which the C– plane (N plane) is exposed. Specifically, the surface of the n-type semiconductor layer 23 is soaked in a KOH solution of 5 mol/l in concentration at about 80° C. for about one minute. In this wet etching conditions, the surface of the n-type semiconductor layer 23 is etched at an average of about 1 µm/min. By this wet etching, in regions (near regions) around crystal defects 24, which are low in crystallinity and are brittle, a defect depression 70 about 1.5 to 3.0 µm deep is formed (FIGS. 7A, 7B). Here, FIG. 7B is an enlarged view of the area enclosed by broken line 7(a2) in FIG. 7A. Because the crystal structure is relatively stable in regions (far regions) other than around crystal defects 24, it does not happen that as the film thickness varies, the etching advances. The other depressions formed in the surface of the n-type semiconductor layer 23 are about 1 µm deep. The difference in depth between the defect depressions 70 and the other depressions is about 0.5 to 2.0 µm. This depth difference derives from the etching rate difference and corresponds to 1.5- to 3-fold. That is, the etching rate is about 1.5 to 3 times faster in the near regions around crystal defects 24 than in the far regions from the crystal defects 24. The reason why the etching rate difference occurs is that the time for the wet etching is as very short as about one minute. That is, the short-time wet etching has the effect of selectively etching the regions around crystal defects 24. By this short-time wet etching, a defect depression 70 is formed on crystal defects 24 which do not appear, due to other projections/depressions, as pits in the surface of the n-type semiconductor layer 23 as well as on crystal defects 24 which appear as pits in the surface of the n-type semiconductor layer 23 (FIG. 7B). Note that the above wet etching conditions can be changed according to the etching amount, the composition of the n-type semiconductor layer 23, or the like. For example, if the concentration of the KOH solution is fixed at 5 mol/l, the temperature and the time can be changed between 80° C. and 90° C. and between 0.5 and 10 min, respectively.

(Insulating Layer Forming Step)

Figure 7C:
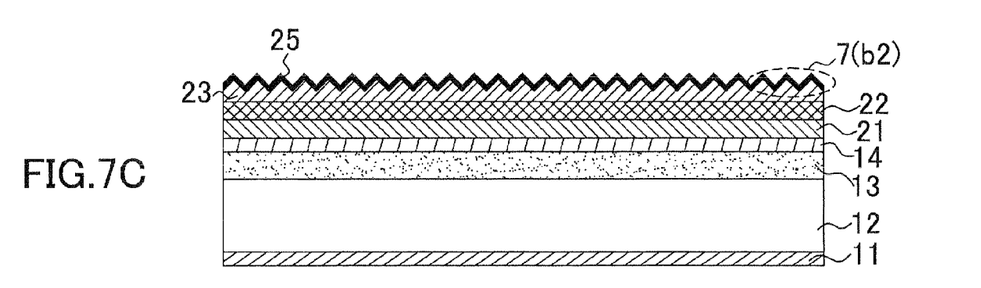
Figure 7D:
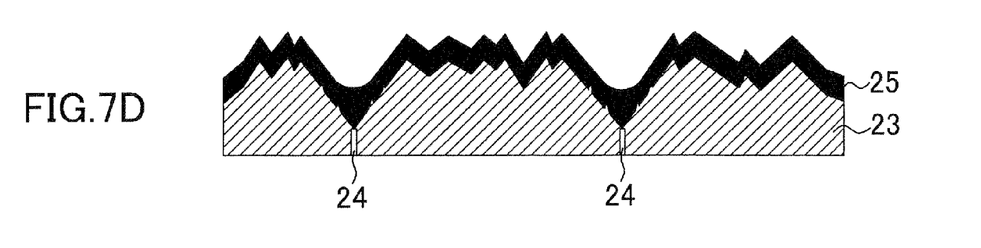

Then, the insulating layer 25 is formed entirely over the surface of the n-type semiconductor layer 23 where defect depressions 70 are formed, by a widely known film forming technique such as a vacuum evaporation method or a sputtering method (FIGS. 7C, 7D). Here, FIG. 7D is an enlarged view of the area enclosed by broken line 7(b2) in FIG. 7C. A material which can transmit light emitted from the active layer 22 is desirable as material for the insulating layer 25. For example, $SiO_2$ can be used. The thickness of the insulating layer 25 is desirably about 150 nm or greater considering the amount of the material removed by polishing at the polishing step described below. Note that the insulating layer 25 needs to have high adhesion so as not to be peeled off by the polishing process described below.

(Polishing Step)

Figure 8A:
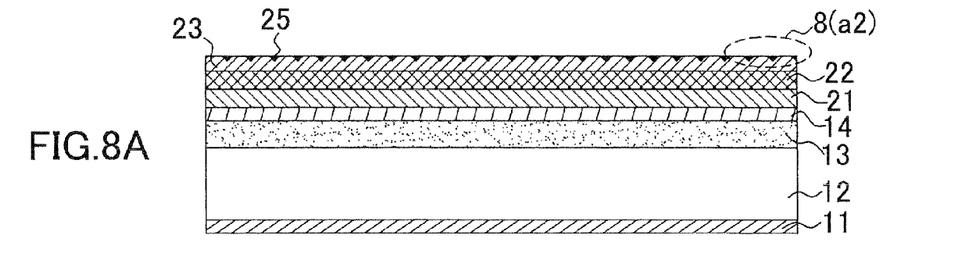
FIGS. 8A-8C are cross-sectional views of the semiconductor light emitting element according to the embodiment of the present invention in production steps respectively.
Figure 8B:
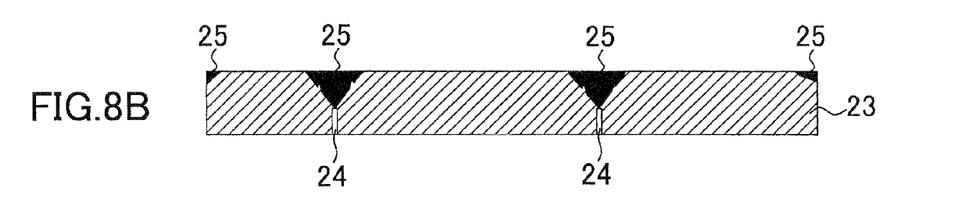

Then, portions of the insulating layer 25 and of the n-type semiconductor layer 23 are removed by a well-known polishing method such as a mechanical polishing method using diamond slurry, a chemical mechanical polishing (CMP) method, or a combination thereof. By this polishing, the entire surface of the surface layer comprising the insulating layer 25 and the n-type semiconductor layer 23 is flattened (FIG. 8A). The surface of the n-type semiconductor layer 23 is a flat surface with only projections/depressions of about 0.5 µm or less, for example. The polishing amount (polishing depth) at this polishing step is desirably adjusted to within the range of about 1 µm to half the depth of defect depressions 70. If the polishing amount is less than this range, the exposed surfaces of the n-type semiconductor layer 23 will be smaller in number, and thus the number of hexagonal pyramidal protrusions 26 formed at the surface roughening step described later will be less than the number necessary to improve the light extraction efficiency. On the other hand, if the polishing amount is greater than this range, the insulating layer 25 may be peeled off by wet etching at the surface roughening step described later. By adjusting the polishing amount to within this range, with the above problems being prevented from occurring, stable regions of the crystal become exposed with only defect depressions 70 deriving from crystal defects 24 filled with the insulating layer 25 (FIG. 8B). Here, FIG. 8B shows an enlarged view of the area enclosed by broken line 8(a2) in FIG. 8A.

(Electrode Layer Forming Step)

Figure 8C:
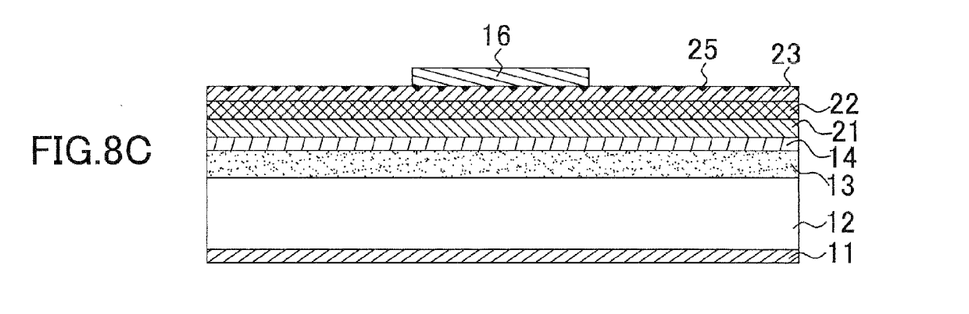

Then, the third electrode layer 16 is formed on part of the flattened surface of the n-type semiconductor layer 23. Specifically, ITO is used as electrode material, and the third electrode layer 16 is formed on substantially the middle of the surface of the n-type semiconductor layer 23 by an arc discharge ion plating method (FIG. 8C). Other than the arc discharge ion plating method, a widely known technique such as a vacuum evaporation method or a sputtering method can also be used. The thickness of the third electrode layer 16 is, for example, about 200 nm. Then, the wafer after the third electrode layer 16 is formed is heated in an oxygen atmosphere at about 600° C. for about one minute. By this heating, the light transmittance of the third electrode layer 16 can be improved. Note that the outermost surface (exposed surface) of the insulating layer 25 filling depressions outside the area where the third electrode layer 16 and the n-type semiconductor layer 23 are joined is located in the same plane as the interface between the third electrode layer 16 and the n-type semiconductor layer 23.

In order to form the electrode layer 16 on a desired area, a method can be used where after a film for the electrode layer 16 is formed, a photoresist film is formed on a desired area by photolithography and where the other area is exposed to an etchant (a mixture of phosphoric acid, nitric acid, and acetic acid), thereby patterning the film. Other than the above forming method, a lift-off method can be used where before forming a film for the electrode layer 16, a photoresist film is formed on the area other than a desired area by photolithography, and where then the electrode layer 16 is formed and the electrode layer 16 except the desired area together with the photoresist film is removed.

(Surface Roughening Step)

Figure 9A:
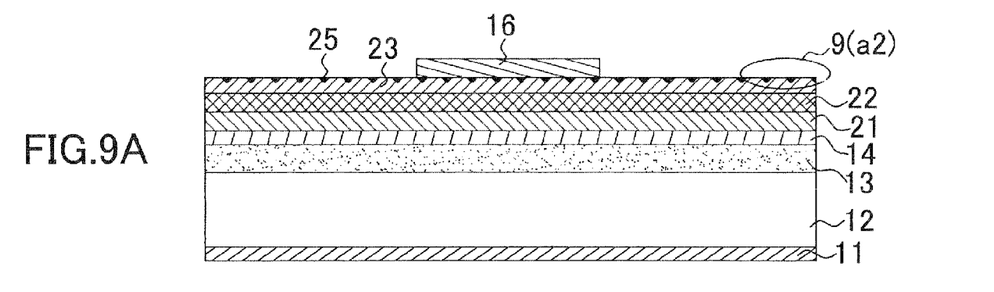
FIGS. 9A-9C are cross-sectional views of the semiconductor light emitting element according to the embodiment of the present invention in production steps respectively.
Figure 9B:
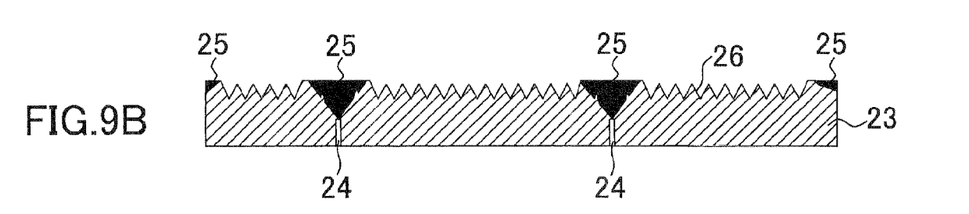

Then, hexagonal pyramidal protrusions 26, effective in improving the light extraction efficiency, are formed in the exposed area of the surface of the n-type semiconductor layer 23 (i.e., the surface except the area where the third electrode layer 16 is formed and the regions filled with the insulating layer 25). Specifically, the surface of the n-type semiconductor layer 23 is soaked in a KOH solution of 5 mol/l in concentration at about 50° C. for about two hours. By this wet etching, multiple hexagonal pyramidal protrusions 26 are formed in the exposed area of the surface of the n-type semiconductor layer 23 where the C− plane (N plane) is exposed as the outermost surface (FIGS. 9A, 9B). Here, FIG. 9B is an enlarged view of the area enclosed by broken line 9(a2) in FIG. 9A. The wet etching conditions at this step are adjusted such that the etching rate at this step is lower than that at the depression forming step.

The hexagonal pyramidal protrusions 26 have a shape deriving from the crystal structure of $Al_xIn_yGa_zN$ having a wurtzite type (hexagonal crystal) of crystal structure, and can be easily obtained with good reproducibility by wet etching using a KOH solution, without using a mask or the like. By performing wet etching under the above conditions, hexagonal pyramidal protrusions 26 about 1 µm wide with the angle between the bottom and the side being about 60 degrees are formed. The hexagonal pyramidal protrusions 26 are smaller than the insulating layer 25 filling dislocation depressions 70. Further, because the hexagonal pyramidal protrusion 26 is formed by wet etching, the top of the hexagonal pyramidal protrusion 26 is located on the n-type semiconductor layer 23 side of the interface between the third electrode layer 16 and the n-type semiconductor layer 23.

Note that the above wet etching conditions can be changed according to the composition of the n-type semiconductor layer 23, the size of the hexagonal pyramidal protrusion 26, or the like. For example, if the concentration of the KOH solution is fixed at 5 mol/l, the temperature and the time can be changed between 50° C. and 70° C. and between 0.5 and 3 hours, respectively. If the wet etching is performed at a temperature lower than this temperature range, the hexagonal pyramidal protrusion 26 will be smaller, and hence a sufficient improvement in the light extraction efficiency may not be achieved. On the other hand, if the wet etching is performed at a temperature higher than this temperature range, the wet etching will be too high, and hence even the active layer 22 may be etched, or the sizes of hexagonal pyramidal protrusions 26 may become non-uniform.

The uniformity of the size and shape of the hexagonal pyramidal protrusions 26 depends also on the surface state of the n-type semiconductor layer 23 just before the wet etching. In the present embodiment, because the flattening by polishing is performed before the wet etching, the hexagonal pyramidal protrusions 26 are formed to have substantially the same size and shape.

Depending on the wet etching conditions, the hexagonal pyramidal protrusions 26 can be formed without changing the thickness of the n-type semiconductor layer 23. In this case, the top of the hexagonal pyramidal protrusion 26 is located in the same plane as the interface between the third electrode layer 16 and the n-type semiconductor layer 23.

When this wet etching has finished, the wafer is taken out of the KOH solution and is cleaned and dried.

(Electrode Pad Forming Step)

Figure 9C:
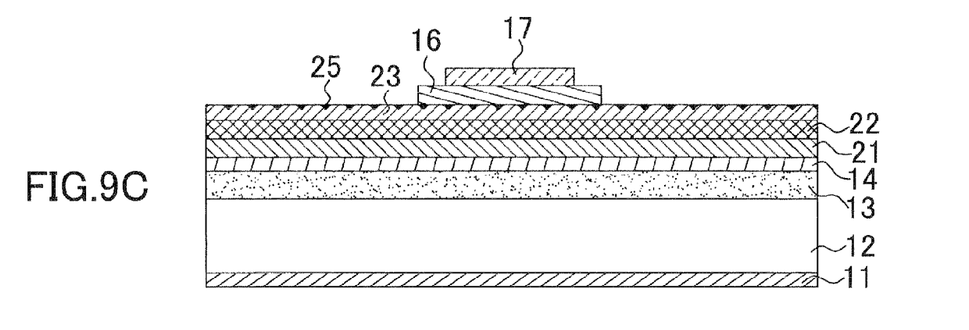

A resist mask having an opening corresponding to an electrode pad-to-be-formed area is formed on the third electrode layer 16 formed at a previous step. Then, metal such as Ti/Au or Ti/Pt/Au is deposited on the third electrode layer 16 through the resist mask by a vacuum evaporation method. Subsequently, by removing the resist mask, an electrode pad 17 is formed on the third electrode layer 16 (FIG. 9C). For example, in the case of a multi-layered film of Ti/Au, the film thickness of Ti is about 25 nm (nanometers), and the film thickness of Au is about 100 nm. The electrode pad 17 may be formed by applying Ag paste or cream solder to the electrode pad-to-be-formed area by screen printing.

(Chip Separating Step)

In order to dividing the wafer having undergone the above steps into chips, a dedicated scribing apparatus equipped with a diamond scribing tool is used. The wafer is mounted in the scribing apparatus and scribed along its scribe lines to be divided into chip units. The wafer may be divided into chips by dicing using a pulse laser. The chip size is, for example, 350 μm×350 μm.

Having undergone the above steps, the semiconductor light emitting element 10 according to the present embodiment is finished.

As described above, in the manufacturing method of the present embodiment, short-time wet etching with an etching time of about one minute is performed after the growth substrate is removed, and after the wet etching, the insulating layer 25 is formed. The formed insulating layer 25 and the n-type semiconductor layer 23 are polished down to a depth of about 1 μm. By this means, only defect depressions 70 deriving from crystal defects 24 are filled with the insulating layer 25, and hence the electrode material of the third electrode layer 16 formed later is prevented from reaching a crystal defect 24. That is, a failure such as a leak or a short is prevented from occurring.

Further, in the manufacturing method of the present embodiment, after the third electrode layer 16 is formed, hexagonal pyramidal protrusion 26 are formed in the surface of the n-type semiconductor layer 23 as a light emitting surface, and hence the third electrode layer 16 is formed on a flat surface, thus suppressing the occurrence of leak current. Further, because hexagonal pyramidal protrusions 26 are formed, total reflection light at the interface (i.e., light not emitted outside) can be reduced as compared with the case where the light emitting surface is flat. That is, a further improvement in the light extraction efficiency of the semiconductor light emitting element 10 can be achieved.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2008-289874, which is hereby incorporated by reference.

What is claimed is:

1. A method of manufacturing a semiconductor light emitting element, comprising:
    a growing step of sequentially growing a first semiconductor layer of a first conductivity type, an active layer, and a second semiconductor layer of a second conductivity type on a growth substrate to form a layered structure;
    a separating step of separating said growth substrate from said layered structure to expose said first semiconductor layer;
    a depression forming step of performing wet etching on an exposed surface of said first semiconductor layer to form defect depressions deriving from crystal defects;
    an insulating layer forming step of forming an insulating layer on the exposed surface of said first semiconductor layer;
    a polishing step of polishing portions of said insulating layer and of said first semiconductor layer to flatten the surface of said first semiconductor layer; and
    a surface roughening step of performing wet etching on the surface of said first semiconductor layer to form protrusions deriving from a crystal structure.

2. A method according to claim 1, wherein in said depression forming step, an etching rate of near regions to crystal defects is faster than an etching rate of far regions from crystal defects.

3. A method according to claim 2, wherein in said depression forming step, the etching rate of near regions to crystal defects is 1.5 to 3 times faster than the etching rate of far regions from crystal defects.

4. A method according to claim 1, comprising, after said polishing step, an electrode forming step of forming an electrode on the flattened surface of said first semiconductor layer.

5. A method according to claim 1, wherein in said polishing step, the polishing depth of said first semiconductor layer and said insulating layer is within the range of from 1.0 μm to half the depth of said defect depressions.

6. A method according to claim 1, wherein in said separating step, said growth substrate is separated from said layered structure by laser lift-off.

7. A method according to claim 1, wherein said first and second semiconductor layers are each made of a group-III nitride semiconductor of a wurtzite structure and are laid one over the other along a C-axis direction of the crystal structure, and said protrusions are hexagonal pyramidal protrusions.

8. A method according to claim 7, wherein the surface of said first semiconductor layer exposed in said separating step is constituted by a plane having a polarity of nitrogen atoms.

9. A method according to claim 8, wherein said first and second semiconductor layers are made of $Al_xIn_yGa_zN$, where $0 \leq x \leq 1$, $0 \leq y \leq 1$, $0 \leq z \leq 1$, and $x+y+z=1$.

* * * * *